United States Patent [19]

Bottomley et al.

[11] Patent Number: 4,506,223
[45] Date of Patent: Mar. 19, 1985

[54] METHOD FOR PERFORMING TWO-DIMENSIONAL AND THREE-DIMENSIONAL CHEMICAL SHIFT IMAGING

[75] Inventors: Paul A. Bottomley, Clifton Park; William A. Edelstein, Schenectady, both of N.Y.

[73] Assignee: General Electric Company, Schenectady, N.Y.

[21] Appl. No.: 443,797

[22] Filed: Nov. 22, 1982

[51] Int. Cl.³ ............................................ G01R 33/08
[52] U.S. Cl. ..................................... 324/309; 324/307
[58] Field of Search ............... 324/300, 307, 309, 311, 324/312

[56] References Cited

U.S. PATENT DOCUMENTS 4,319,190  3/1982  Brown .................................. 324/309
4,339,716  7/1982  Young .................................. 324/309
4,355,282  10/1982  Young et al. ....................... 324/309
4,361,807  11/1982  Burl et al. ........................... 324/309

*Primary Examiner*—Michael J. Tokar
*Attorney, Agent, or Firm*—Geoffrey H. Krauss; James C. Davis, Jr.; Marvin Snyder

[57] ABSTRACT

Selective excitation is used to excite to resonance nuclear spins located in a predetermined region of an NMR sample. Variable amplitude gradients are then used to phase encode spatial information into the NMR signal produced by the excited nuclear spins. Fourier transformation of the NMR signal, observed in the absence of magnetic field gradients, yields information of the spatial distribution of chemical shifts in the predetermined region of the NMR sample. In NMR chemical shift imaging methods using multiple angle projection reconstruction techniques, projections are built up along a gradient point-by-point by use of selective RF pulses having variable frequency content. Non-selective 180° RF pulses are used with the imaging methods to produce NMR spin echo signals.

36 Claims, 14 Drawing Figures

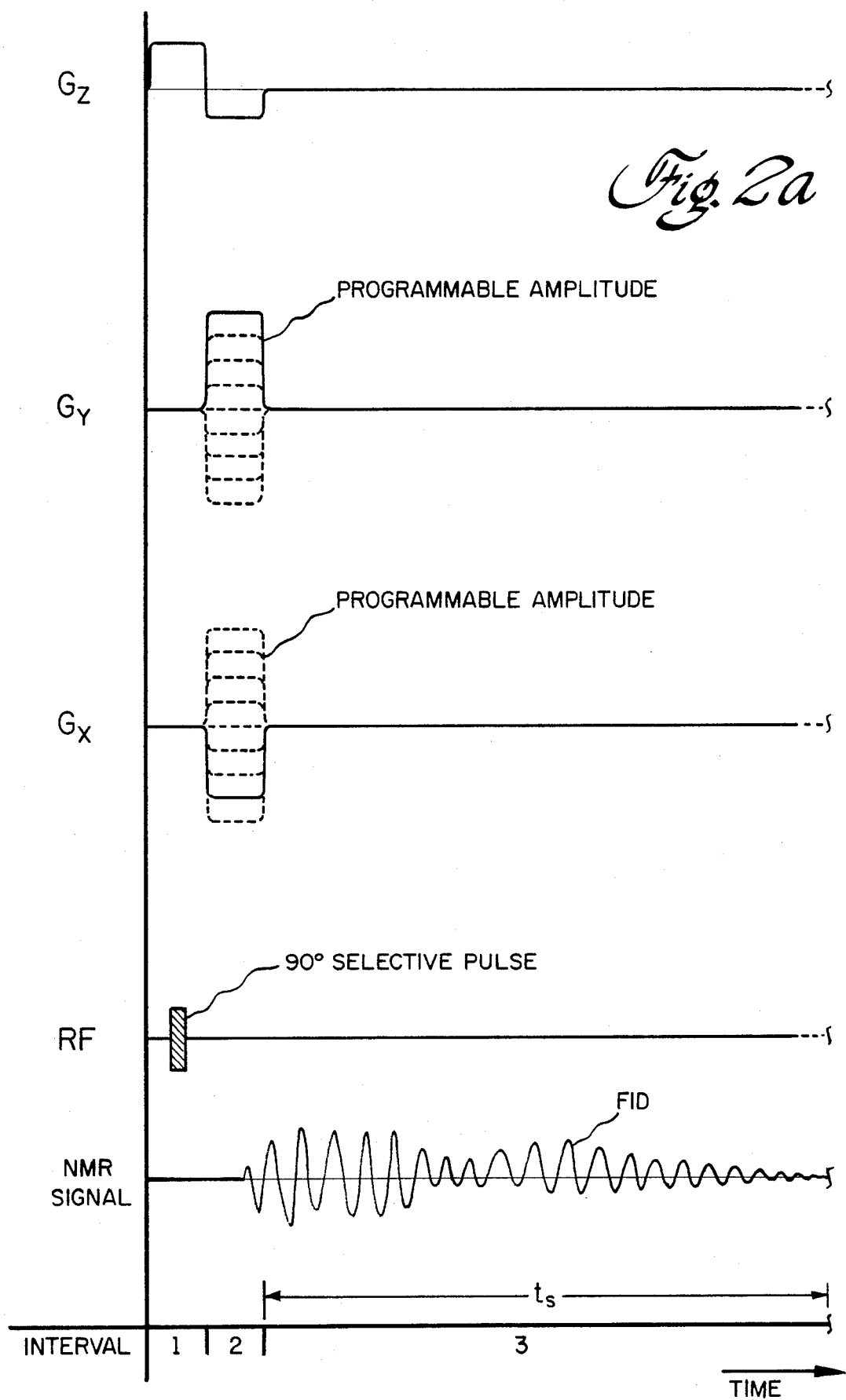

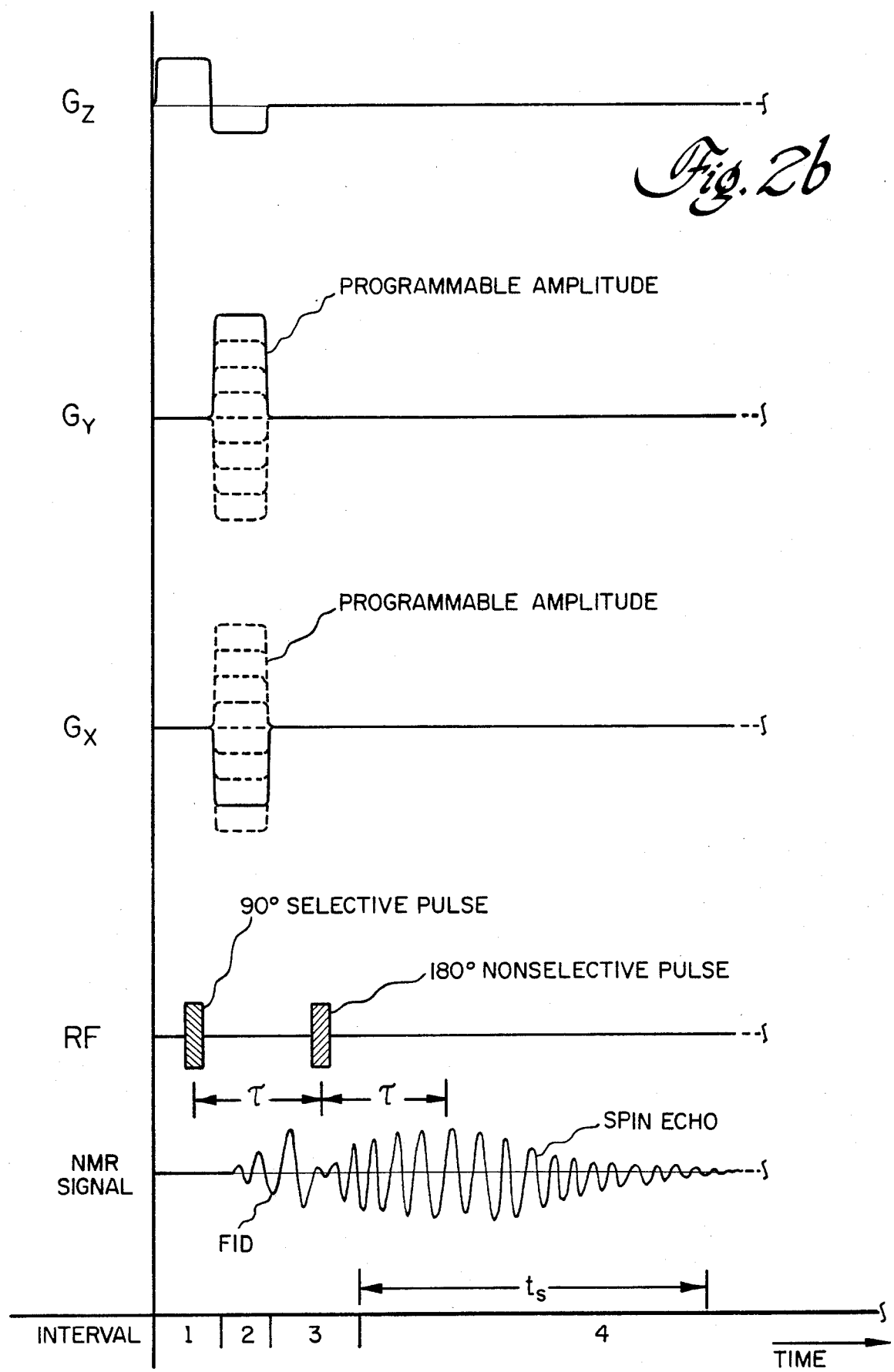

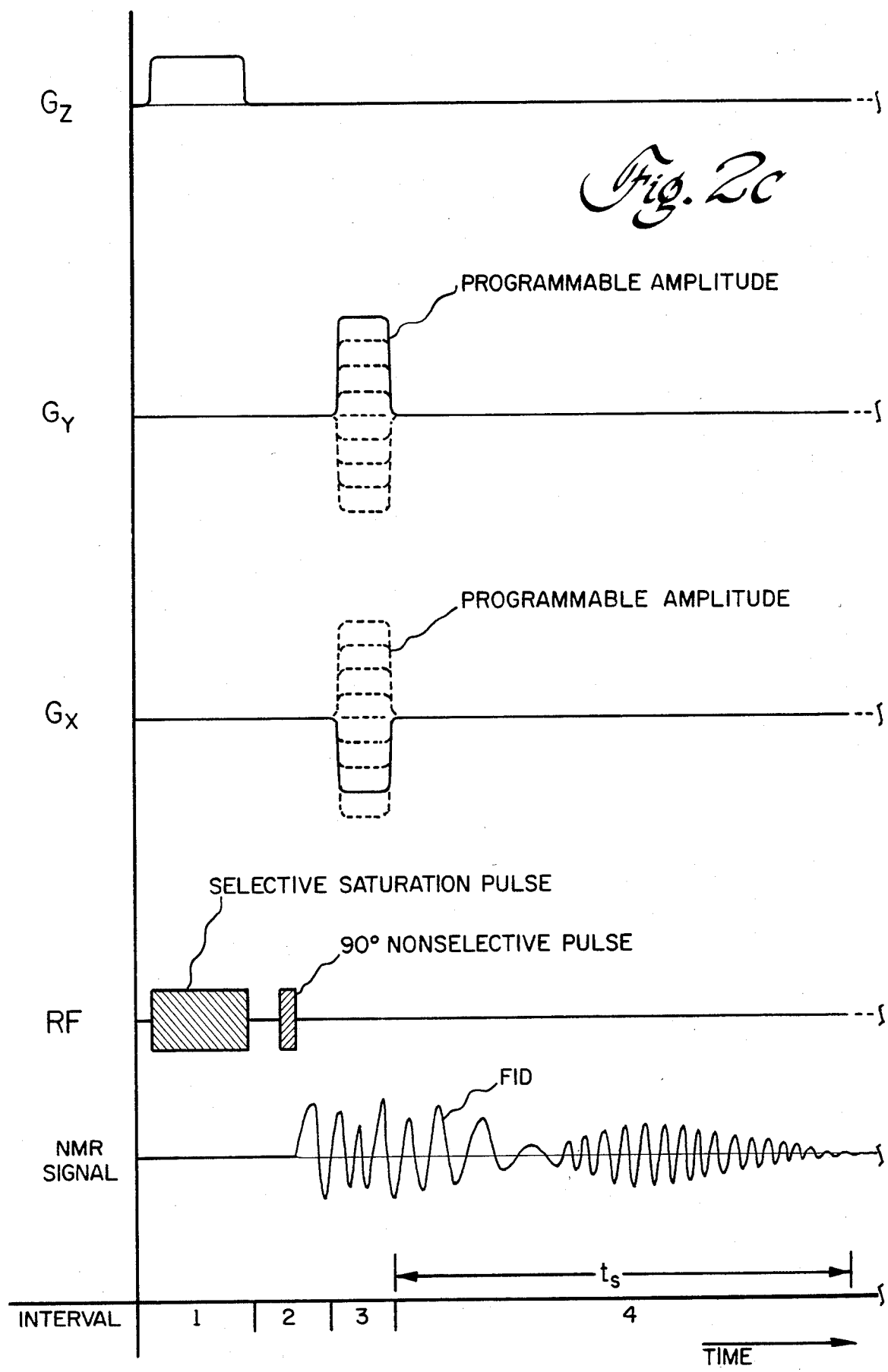

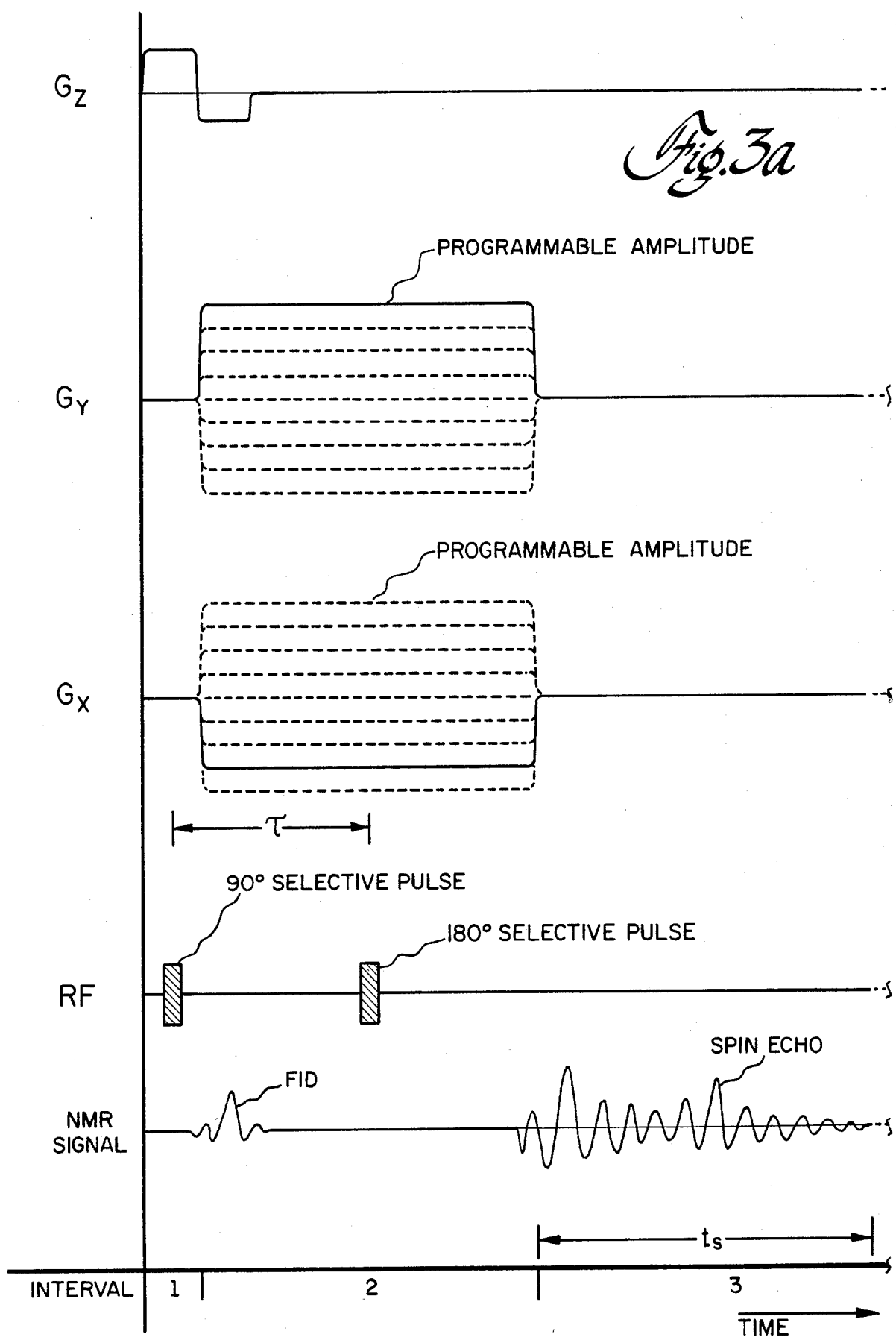

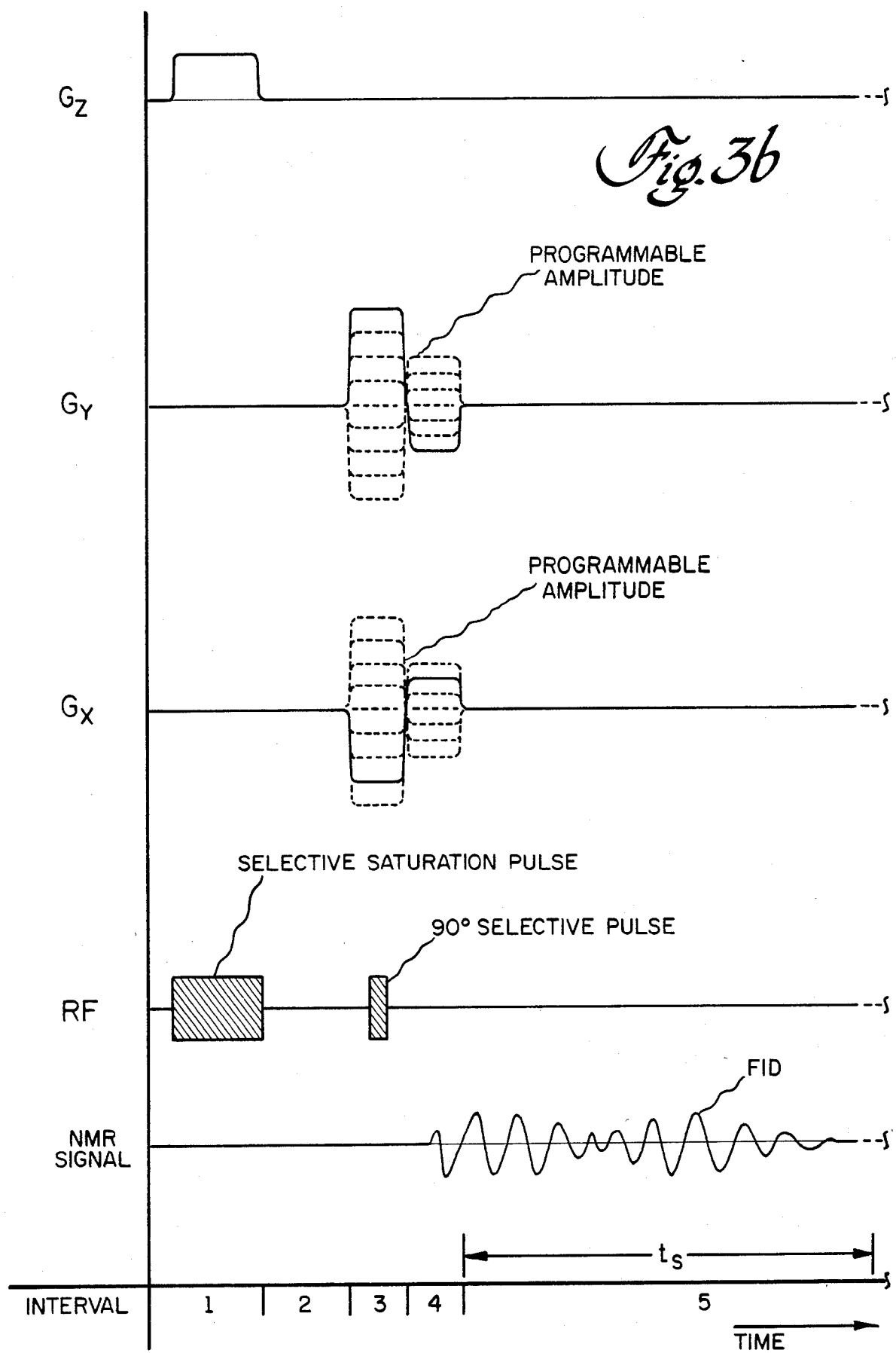

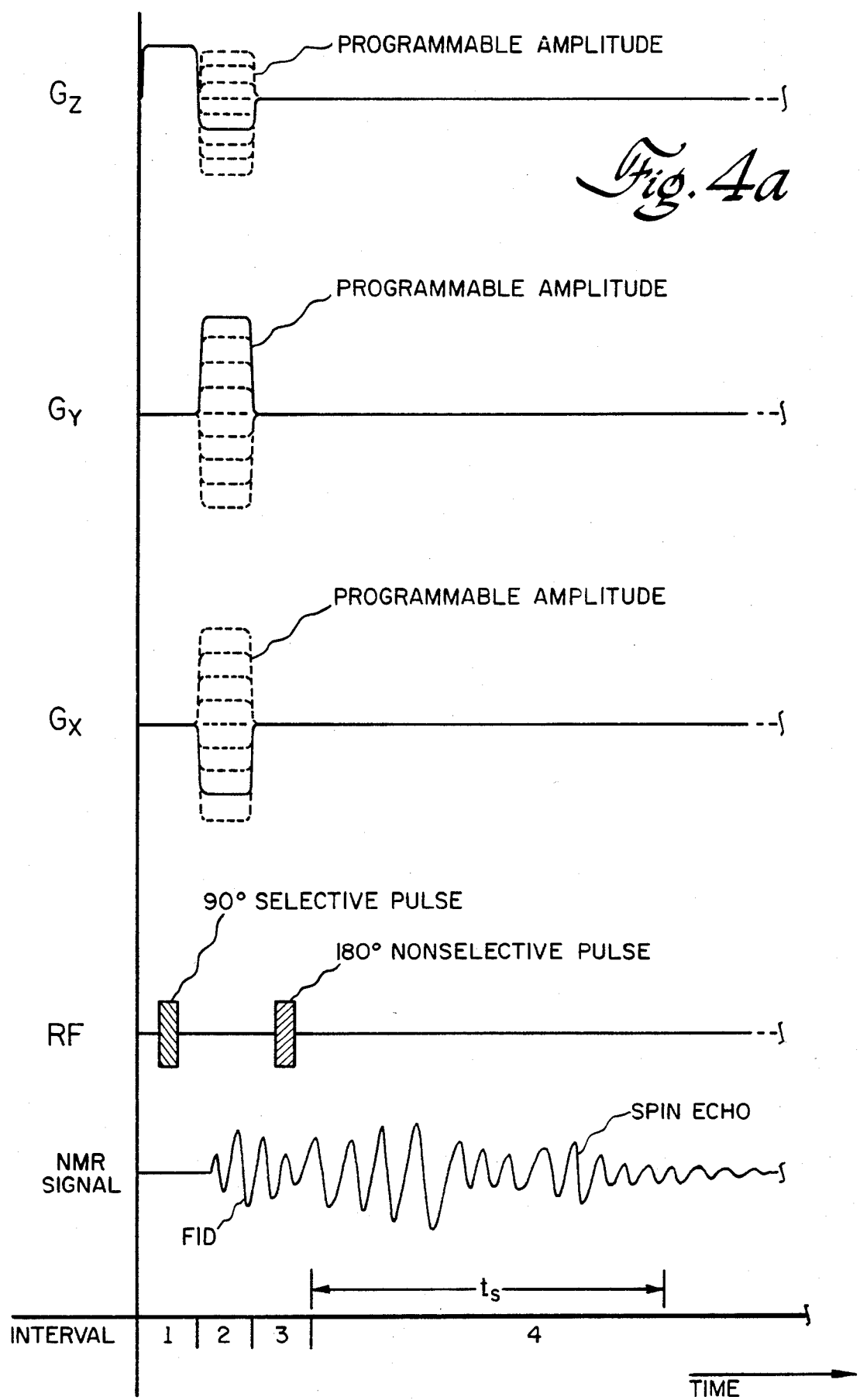

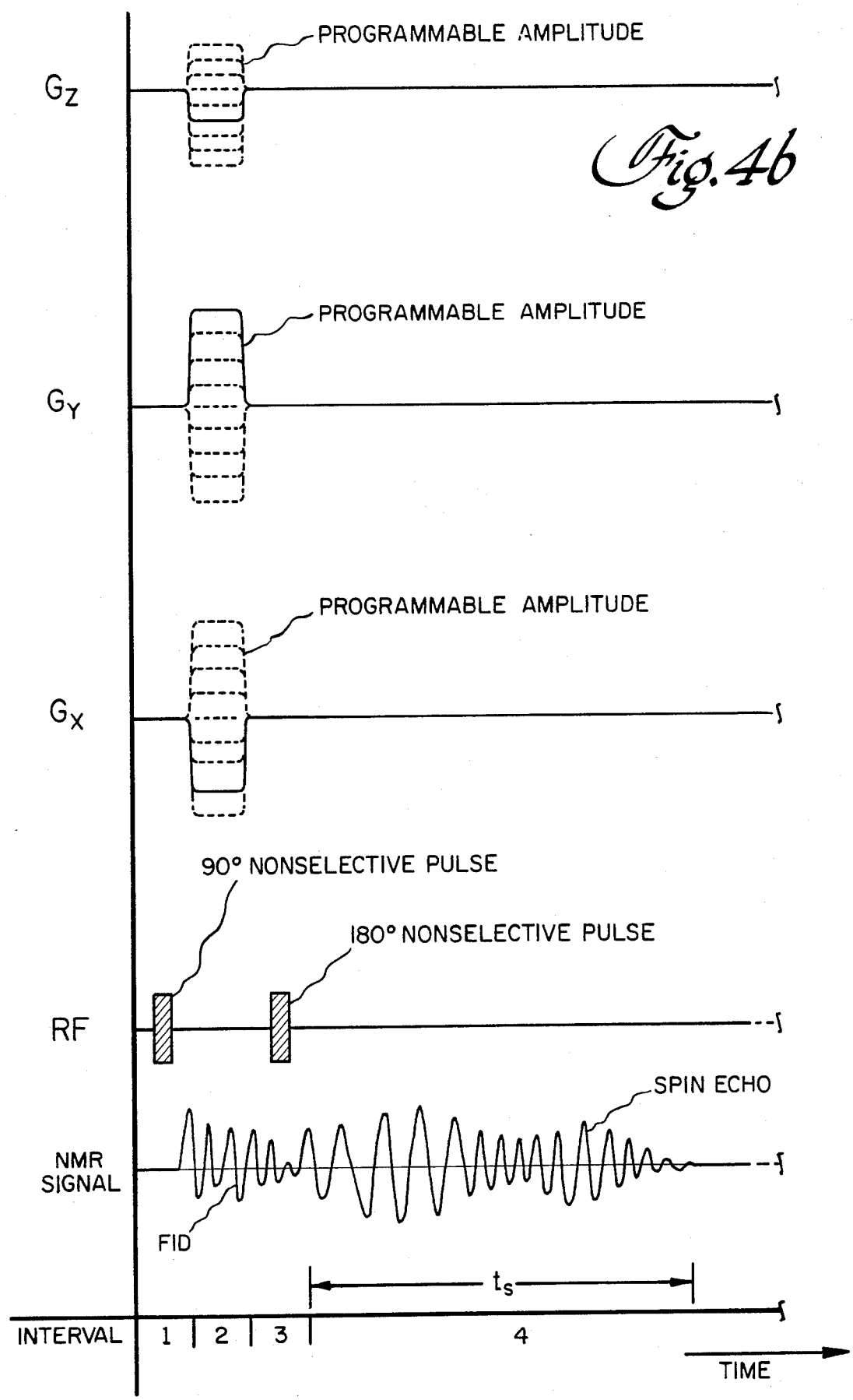

METHOD FOR PERFORMING TWO-DIMENSIONAL AND THREE-DIMENSIONAL CHEMICAL SHIFT IMAGING

BACKGROUND OF THE INVENTION

This invention relates to spectroscopic methods using nuclear magnetic resonance (NMR). More specifically, the invention relates to methods for performing spatially localized NMR chemical shift imaging.

Atomic nuclei having net magnetic moments placed in a static magnetic field, $B_o$, oscillate or precess about the axis of field $B_o$ at an NMR (Larmor) frequency $\omega$ given by the equation $$\omega = \gamma B_o \quad (1)$$

in which $\gamma$ is the gyro-magnetic ratio, constant for each NMR isotope. The frequency at which the nuclei precess is primarily dependent on the strength of the magnetic field $B_o$, and increases with increasing field strength. Chemical shifts occur where the NMR frequency of resonant nuclei of the same type in a given molecule differ because of different magnetic environments produced by differences in their chemical environment. For example, electrons partially screen the nucleus from the externally applied magnetic field and thereby affect its resonant frequency. The degree of shielding caused by the electrons depends on the environment of the nucleus, and thus the chemical shift spectrum of a given molecule is unique and can be used for identification. Because the resonant frequency, hence the absolute chemical shift, is dependent on the strength of the applied field, the chemical shift is expressed as fractional shift in parts-per-million (ppm) of the resonance frequency relative to an arbitrary reference compound. By way of illustration, the range of chemical shifts is about 10 ppm for protons ($^1H$), 30 ppm for phosphorus ($^{31}P$), and 200 ppm for carbon ($^{13}C$). In order to discern such small chemical shifts, the homogenity of field $B_o$ must exceed the differences in chemical shifts of the peaks in the spectrum and typically is much better than 1 part in $10^6$ (1 ppm).

In conventional NMR spectroscopy, chemically shifted signals are observed from the whole of the NMR sample placed in the region to which the NMR coil is sensitive. While this is satisfactory for studying the chemical structure of a homogeneous sample, to enable discrimination of normal and abnormal conditions in biological or medical diagnostic applications where samples are in general heterogeneous, it is desirable to obtain spatial information concerning the chemically shifted signal components. For instance, phosphorus exists in the body attached to key molecules involved in metabolism. The localized measurement of the amplitudes of the phosphorus spectral lines could provide a direct and unique measure of cellular energy and of the state of health of the tissue in the region examined.

In the past, surface coil, topical, and sensitive point NMR methods have been used to perform localized chemical shift spectroscopy. These methods are described, respectively, by J. J. H. Ackerman et al., *Nature*, Volume 283, page 167 (1080); R. E. Gordon et al., *Nature*, Volume 287, page 736 (1980); and P. A. Bottomley, *Journal of Physics E: Scientific Instruments*, Volume 14, page 1081 (1981). In all of these methods the data is gathered from a single localized region at a time so that many localized regions must be individually observed in order to obtain sufficient spatial data to construct an entire image.

More efficient data collection methods have been proposed in which the NMR imaging data is gathered simultaneously from many points. One example is the selective excitation zeugmatography method described by P. C. Lauterbur in *The Journal of the American Chemical Society*, Volume 97, page 6866 (1975). Another example is the $^{31}P$ spectroscopic zeugmatography method described by P. Bendel et al., in *The Journal of Magnetic Resonance*, Volume 38, page 343 (1980).

The method disclosed by Lauterbur, et al. is based on the projection reconstruction method of NMR spin density imaging. In this method, each one-dimensional projection is obtained point-by-point by selective excitation of a plane of spins lying perpendicular to a magnetic field gradient oriented at the projection angle. The Fourier transform of the NMR signal in the absence of the gradient yields the chemical shift spectrum of the selected plane of spins and corresponds to one point in the projection. Subsequent points in the projection are obtained by changing the main magnetic field strength. Upon completion of a projection, the gradient is reoriented within the desired imaging plane and the process repeated to obtain spectra for each point in all of the projections. Except for the inherent RF field inhomogeneity afforded by the receiver coil geometry, no provision for localization in the third dimension is made. The selective excitation pulses employed are amplitude-modulated (tailored) pulses of long duration to give narrow excitation bandwidths.

The method disclosed by Bendel, et al. is also based on reconstruction from projections. In order to obtain spatial resolution of the chemical shift spectra, magnetic field gradients, at a predetermined projection angle, are applied while the NMR signal is recorded so as to broaden the individual spectral lines of the spectrum. Multiple projections are obtained by changing the orientation of the projection angle. A disadvantage of this method is the limited resolution obtained of the individual projections of each compound due to the relatively weak magnetic gradient field which must be used: If stronger gradient fields are used, the spectral lines are so broadened that they overlap to such an extent that the chemical shift information is effectively lost. In general, this is also the reason why conventional NMR spin density imaging methods fail to yield chemical shift data. In such methods, the NMR signal is typically observed in the presence of strong gradient fields which provide spatial distribution information of the nuclear spin density, but which obliterate the chemical shift spectrum. The effects of gradients and chemical shifts on the NMR signal are similar and cannot be distinguished without prior knowledge of either spatial structure or chemical shift.

It will be readily appreciated, therefore, that, although the inventive methods described and claimed herein bear similarity to various NMR proton imaging techniques, there are important differences necessitated by the fact that the NMR signal (hence spatial localization data obtained) must be observed in the absence of magnetic field gradients. Moreover, chemical shift imaging is a five-dimensional problem (three spatial variables, intensity, and chemical shift) that is significantly more difficult than NMR imaging which involves only four variables (three spatial variables, plus intensity).

Accordingly, it is an object of the invention to provide methods for localized NMR chemical shift imaging.

It is another object of the invention to provide NMR chemical shift imaging methods in which the NMR signal is observed in the absence of magnetic field gradients.

It is still another object of the invention to provide efficient NMR chemical shift imaging methods wherein data is collected from many sample regions simultaneously to reduce data acquisition time.

SUMMARY OF THE INVENTION

Two-dimensional and three-dimensional NMR chemical shift imaging is performed by exciting to resonance nuclear spins located in a predetermined region of an NMR sample situated in a static magnetic field. Information of the spatial distribution of the chemical shift spectra is phase encoded into the NMR signal produced by the excited nuclear spins by the application of variable amplitude magnetic field gradients. The NMR signal is observed in the absence of magnetic field gradients. Fourier transformation of the observed NMR signal yields information of the spatial distribution of the chemical shift spectra in the predetermined region. Additional data is obtained by repeating the experiment with a different gradient amplitude.

In another method for performing NMR chemical shift imaging using multiple angle projection reconstruction, nuclear spins are first excited to resonance in a predetermined region of an NMR sample located in a static magnetic field. The NMR sample is then irradiated with a selective RF pulse in the presence of a magnetic field gradient to invert those excited nuclear spins situated in a strip-like region oriented orthogonal to the direction of the magnetic field gradient. The inverted nuclear spins produce an NMR spin echo signal which, upon Fourier transformation, yields chemical shift data at one point in a projection directed along the direction of the magnetic field gradient. Additional points are obtained by varying the frequency content of the selective RF pulse, while additional projections are obtained by varying the orientation of the gradient.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

FIGS. 2a-2c depict NMR pulse sequences of the invention suitable for obtaining phase encoded chemical shift imaging data from a planar volume;

FIGS. 3a and 3b depict NMR pulse sequences of the invention in which chemical shift imaging data is obtained from a planar volume by multiple angle projection reconstruction;

FIGS. 4a and 4b are similar to FIGS. 2a-2c, but in which additional phase encoding is provided in a third direction to simultaneously obtain chemical shift imaging data from a thick planar slab;

DETAILED DESCRIPTION OF THE INVENTION

Figure 1:
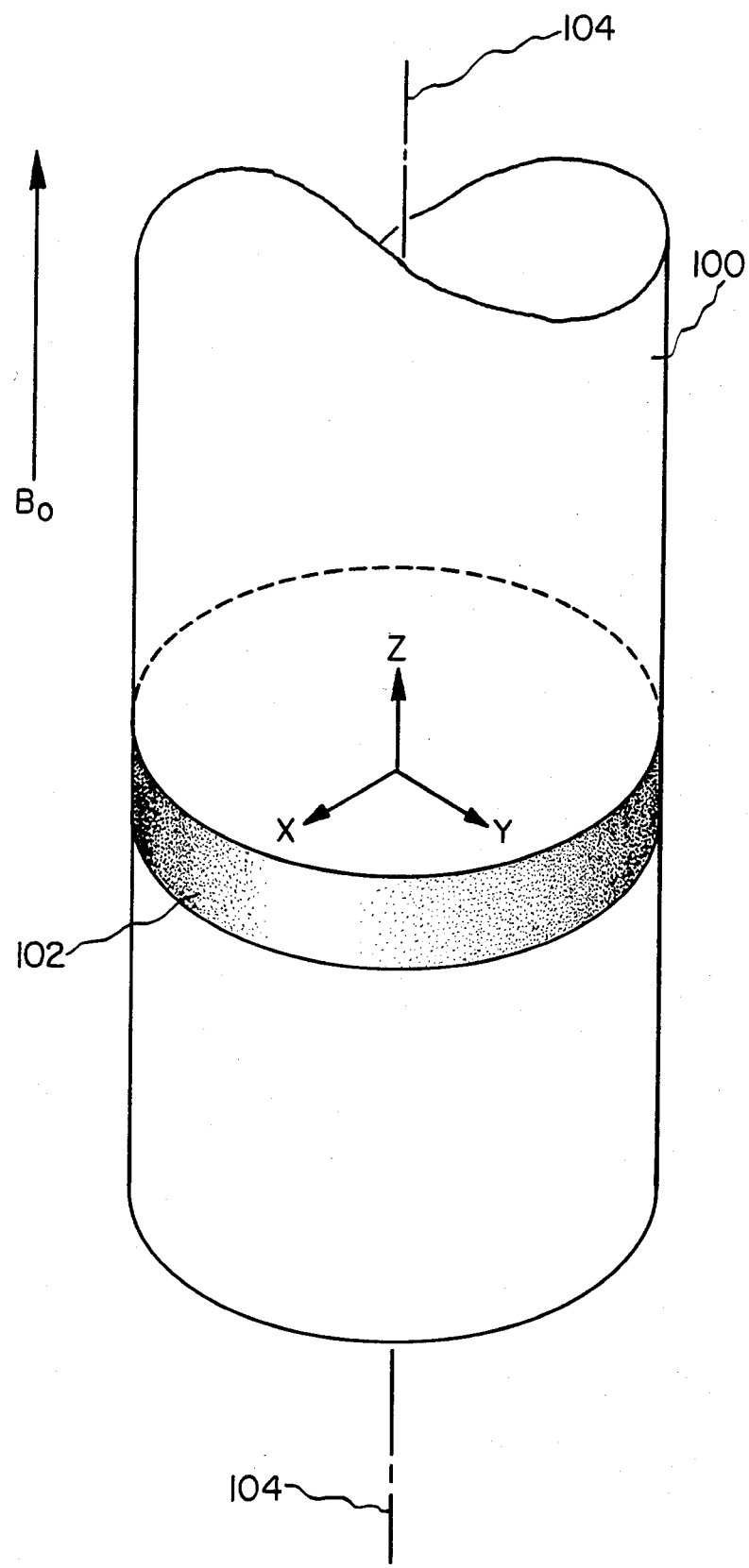
FIG. 1 illustrates an NMR sample situated in a static magnetic field and having a planar volume defined therein by selective irradiation.

The inventive NMR pulse sequences depicted in FIGS. 2a-2c, 3a-3b and 4a-4b will be best understood if initial reference is made to FIG. 1 which depicts an NMR sample 100 situated in a static homogeneous magnetic field $B_o$ directed in the positive Z-axis direction of the Cartesian coordinate system. The Z-axis is selected to be coincident with the long or cylindrical axis 104 of sample 100. The origin of the coordinate system is taken to be the center of the sample, which is also at the center of a planar slice or volume 102 selected by the principle of selective irradiation in the presence of magnetic field gradients, as will be described hereinafter.

It is further beneficial to the understanding of the invention to observe that in each pulse sequence the NMR sample is positioned in a static field $B_o$ which is accordingly omitted from the figures depicting NMR pulse sequences.

In addition, in each pulse sequence magnetic field gradients are necessary to produce spatial localization of the NMR signal to that originating in predetermined regions of planar slice 102 of FIG. 1. Typically, three such gradients are necessary:

$$G_x(t) = \partial B_o / \partial x \qquad (2)$$

$$G_y(t) = \partial B_o / \partial y \qquad (3)$$

$$G_z(t) = \partial B_o / \partial z \qquad (4)$$

The $G_x$, $G_y$, and $G_z$ gradients are constant throughout planar volume 102, but their magnitudes are typically time dependent. The magnetic fields associated with the gradients are denoted, respectively, $b_x$, $b_y$, and $b_z$, wherein $$b_x = G_x(t)x \qquad (5)$$

$$b_y = G_y(t)y \qquad (6)$$

$$b_z = G_z(t)z \qquad (7)$$

within the volume.

RF magnetic field pulses are directed orthogonal to the $B_o$ field and are used along with magnetic field gradients to excite specific nuclear spins to resonance. The frequency of the RF pulse needed to induce resonance is the same as the Larmor frequency defined by equation (1). Two types of RF magnetic field pulses commonly used are 90° and 180° pulses. A 90° RF pulse causes nuclear magnetic moments to rotate 90° about the axis defined by the applied RF magnetic field vector in a Cartesian coordinate frame of reference rotating at the resonant frequency about the direction of field $B_o$, relative to the laboratory frame of reference. The rotating Cartesian coordinate frame is denoted by primes X', Y', Z', the Z'-axis being coincident with the Z-axis in the laboratory frame of reference. Thus, if the direction of field $B_o$ is assumed to be the positive Z-axis direction of the laboratory Cartesian coordinate system, a 90° RF pulse will cause nuclear magntization along $B_o$ to rotate into the transverse plane defined by the X'- and Y'-axis, for example. Similarly, a 180° RF pulse causes nuclear magnetization along $B_o$ to rotate 180° from the positive Z'-axis direction to the negative Z'-axis direction.

It should be further noted that RF pulses may be selective or nonselective. Selective pulses are typically modulated to have a predetermined frequency content so as to excite nuclear spins situated in preselected regions of the sample having magnetic field strengths as defined by equation (1). The selective pulses are applied in the presence of the localizing magnetic field gradients. Nonselective pulses generally affect all of the nuclear spins situated within the field of the RF pulse transmitter coil, and are typically applied in the absence of the localizing magnetic field gradients.

Reference is now made to FIG. 2a which depicts one embodiment of an NMR pulse sequence suitable for performing chemical shift imaging of planar slice 102 (FIG. 1). In interval 1, shown along the horizontal axis of FIG. 2a, nuclear spins situated in planar volume 102 are selectively excited by the application of a selective 90° RF pulse in the presence of a positive magnetic field gradient $G_z$, as identified along the vertical axis. Following the selective excitation, the spins in volume 102 precess at the same frequency, but are out of phase with one another because the excitation occurred in the presence of a gradient. To reduce the phase dispersion, a negative $G_z$ gradient is applied in interval 2. The negative $G_z$ gradient is selected such that the integral thereof with respect to time over interval 2 is equal to approximately one half the integral with respect to time of the positive $G_z$ gradient over interval 1.

Spatial information is phase encoded into the free induction decay (FID) NMR signal occurring in interval 3 by the application in interval 2 of magnetic field gradients $G_x$ and $G_y$ having $n_x$ and $n_y$ amplitudes, respectively, as schematically implied by the dashed lines. The number of amplitudes $n_x$ and $n_y$ is selected with reference to the size of the spatial matrix into which volume 102 is to be partitioned. As an example, $n_x$ and $n_y$ may each be selected to equal 10, in which case the matrix comprises 100 points ($n_x \cdot n_y$). One way in which spatial information may be phase encoded into the FID signal is to select one of $n_x$ amplitudes of gradient $G_x$ and, in successive applications of the pulse sequence, step gradient $G_y$ through each of $n_y$ amplitudes. Thereafter, a different one of the $n_x$ amplitudes is selected and $G_y$ again sequenced through $n_y$ amplitudes. An FID signal is obtained for each combination of $G_x$ and $G_y$ gradient amplitudes. Spatial information is thus obtained for each point in the 10×10 matrix.

The effect of applying the $G_y$ gradient is to encode spatial information in the Y-axis direction by introducing a twist in the orientation of the nuclear spins by an integral multiple of $2\pi$ over the total length of sample 100 in the Y-axis direction. Following the application of the first phase encoding gradient, the nuclear spins are twisted into a one-turn helix. Each different amplitude of gradient $G_y$ introduces a different degree of twist (phase encoding). In practice, the signals are averaged several times prior to advancing the $G_y$ gradient in order to improve the signal-to-noise ratio. Variation of the amplitude of the $G_x$ gradient provides phase encoding in the X-axis direction.

The individual FID signals are sampled (in quadrature) in interval 3 in the absence of gradients to obtain chemical shift information. Each FID may be sampled 256 times over interval $t_s$, for example. However, a higher or lower sampling rate may be used to obtain, respectively, higher or lower spectral resolution. Thus, upon completion of the data-gathering process, 100 FID signals will have been observed and wherein each of the signals will have been sampled 256 times to provide 256 spectral data points at each of the 100 points of the spatial matrix.

Imaging information regarding the spatial distribution of the chemical shifts is obtained by known three-dimensional Fourier transform methods. Briefly, a first Fourier transform of each FID signal with respect to time $t_s$ yields spectral chemical shift information from all points of the spatial matrix. The spectral information, however, is not directly usable since it also contains spatial information encoded therein by the variable amplitude $G_x$ and $G_y$ gradients. Additional Fourier transformation with respect to each of $G_x$ and $G_y$ yields the desired spatial distribution information of the chemical shift spectra.

A preferred NMR pulse sequence for performing planar chemical shift imaging is depicted in FIG. 2b. This sequence is similar to that shown in FIG. 2a, with the notable exception that following the application of the $G_x$ and $G_y$ gradients in interval 2 (FIG. 2b), a nonselective 180° RF pulse is applied in interval 3 to invert the nuclear spins so as to produce a delayed spin echo signal in interval 4. The advantage of this technique is that the entire spin echo signal may be observed in interval 4 for period $t_s$ at a time when $G_x$ and $G_y$ gradient coil currents have subsided and thus do not interfere with the FID signal. In the pulse sequence of FIG. 2a, the FID signal begins at the end of interval 2 while gradients $G_x$ and $G_y$ are transient. Since the effect of gradients on the FID cannot be distinguished from that of the shielding effect producing the local magnetic field variations, data observed up to the end of interval 2 cannot normally be used. Also, during interval 2 of FIG. 2a, in addition to the dephasing caused by the spatial encoding gradients $G_x$ and $G_y$, there is an additional loss of phase coherence between nuclear spins due to the inherent inhomogeneities present in the main field $B_o$. This dephasing is reversed (by the 180° pulse) in the sequence of FIG. 2b, but not in that of FIG. 2a.

FIG. 2c depicts another pulse sequence similar to that shown in FIG. 2a, but in which a long, powerful, selective saturation pulse is applied in interval 1 in the presence of a pulsed $G_z$ gradient. The frequency content of the saturation pulse is selected so as to saturate nuclear spins outside planar slice 102 (FIG. 1), but to leave unaffected the nuclear spins within the planar slice. The use of such a selective irradiation pulse in an NMR proton density imaging context is disclosed by A. N. Garroway, et al. in *Solid State Physics*, Vol. 7, L457 (1974). Following a short wait on the order of a millisecond or longer to allow pulse currents to subside, a nonselective 90° RF pulse is applied in interval 2 to excite to resonance nuclear spins in the planar slice 102. An FID signal is produced by the excited spins shortly before the termination of the 90° RF pulse and continues through interval 3, during which $G_x$ and $G_y$ gradients are applied, and into interval 4 where it is sampled at the desired rate. An alternative (not shown) to selective saturation which will produce a similar effect in this pulse sequence is to use in interval 1 a selective 90° RF pulse with frequency components chosen to irradiate the entire sample 100 (FIG. 1), except the chosen volume 102 in the presence of the pulsed magnetic field gradient $G_z$. In this alternative, $G_z$ is left on for several milliseconds after the 90° pulse ends in order to rapidly dephase and destroy the NMR signal originating outside planar volume 102. Spatial chemical shift data is obtained, as before, by three-dimensional fourier transformation.

A 180° nonselective RF pulse may be applied following interval 3 (FIG. 2c) so as to produce a delayed spin echo signal, as described with reference to FIG. 2b, to improve the observation of the NMR signal.

FIG. 3a depicts an NMR pulse sequence suitable for obtaining chemical shift imaging data by the multiple angle projection reconstruction method. It is important to emphasize that the difference between this method as used in chemical shift imaging and, for example, its application to proton density imaging is that in chemical shift imaging the use of magnetic field gradients while the FID is on to obtain multiple projections cannot be tolerated. In chemical shift imaging, therefore, each one-dimensional projection is obtained, one spatial point at a time, wherein each spatial point consists of a chemical shift spectrum (corresponding to that point) recorded in the absence of the applied gradients.

Referring now to FIG. 3a, a selective 90° RF pulse is applied in interval 1 in the presence of a positive $G_z$ gradient to excite nuclear spins located in planar slice 102 (FIG. 1). In interval 2, the polarity of the $G_z$ gradient is reversed and the magnitude halved to rephase the excited nuclear spins, as previously described with reference to FIG. 2a. Additionally, in interval 2 gradients $G_x$ and $G_y$ are applied. The amplitudes of these gradients are selected such that the vectorial addition thereof produces a resultant gradient, $G_r$, having a direction coincident with the direction of a first projection. At the midpoint of interval 2, a selective 180° RF pulse is applied with a frequency content selected to invert nuclear spins in a line orthogonal to the direction of the $G_r$ gradient. Thus, although the FID signal in interval 2 originates from the entire planar volume 102, the spin echo signal obtained in interval 3 is produced solely by the spins inverted by the 180° RF pulse. The spin echo signal is sampled in interval 3 at the desired rate, as described hereinabove. The spin echo signal represents one point in the one-dimensional projection, but also contains chemical shift information. Additional points in the projection are obtained by repeating the pulse sequence and varying the frequency content of the 180° pulse (while holding $G_x$ and $G_y$ gradients constant) so as to invert nuclear spins in another line orthogonal to the $G_r$ gradient. This process may be repeated, for example, 10 times to obtain 10 points in a single projection. An alternative to varying the frequency content of the 180° RF pulse to obtain each point of the projection is to change the ratio of currents in each half of each of the coils that generate the $G_x$ and $G_y$ components of the magnetic field gradient $G_r$ while holding the frequency content of the 180° RF pulse unchanged. The direction of the $G_r$ gradient is thereby left unchanged. This method may be best understood if it is considered that a gradient coil pair produces a magnetic field which increases linearly from some negative value of magnetic field near one of the coil halves forming the gradient coil pair to some positive value close to the other coil half. When currents in each coil half are equal, the point at which the magnetic field has zero value is at the midpoint between the coils providing, of course, that each coil half is wound identically. The effect of increasing the current in one of the coil halves and decreasing it in the other is to shift the point at which the magnetic field has a value of zero closer to the coil half with the lower current, thereby shifting the position of the point of the projection when the frequency content of the RF pulse is kept unchanged. It should be noted that the point of the magnetic field gradient having a value of zero corresponds to the resonant frequency $\omega$ of the RF pulse, as predicted by equation (1), so that the RF pulse affects nuclear spins situated in the vicinity thereof.

In order to obtain additional projections, the amplitudes of the $G_x$ and $G_y$ gradient are changed (as suggested by the dashed lines in FIG. 3a) so as to obtain a resultant $G_r$ gradient having a different orientation. The next projection is then obtained by sequencing the frequency content of the selective 180° pulse, so as to invert nuclear spins in a series of lines perpendicular to the newly selected $G_r$ gradient or to sequence the ratio of gradient coil currents as noted above. Then projections may be obtained, for example, at 18° intervals to cover a 180° arc of planar slice 102.

The 180° pulse is applied at the midpoint of interval 2, and the amplitudes of the $G_x$ and $G_y$ gradients are selected such that the integral with respect to time of each gradient over the first half is equal to the integral with respect to time of the gradient over the second half of interval 2. In this manner, spurious NMR signals, produced by imperfect 180° pulses, are suppressed while the spin echo signal remains unaffected since the dephasing effect of the gradients in the first half of interval 2 is balanced by the gradient rephasing in the second half. A method for eliminating the effects of spurious FID signals produced by imperfect 180° RF pulses is disclosed and claimed in application Ser. No. 394,355, filed July 1, 1982, and assigned to the same assignee as the present invention.

Spatial chemical shift imaging information is obtained by Fourier transformation of each spin echo signal. This yields a chemical shift spectrum of a point in a projection. In practice, Fourier transformation with respect to $t_s$ is performed for each FID immediately upon its observation and the resultant chemical shift data stored in computer memory for subsequent use. After a complete set of spectra for all of the points of all of the projections are obtained, chemical shift images of each peak in the spectra may be reconstructed using, for example, known filtered-back projection techniques similar to those developed for X-ray computed tomography.

Another scheme for performing chemical shift imaging using multiple angle projection reconstruction is depicted in FIG. 3b. In this case, a selective saturation pulse is applied in the presence of a $G_z$ gradient, as previously described, to isolate nuclear spins in planar volume 102. Interval 2 is provided to allow gradient pulse currents to subside. In this method, as in that of FIG. 3a, the projections are built up point-by-point in the absence of gradients. Thus, in interval 3, FIG. 3b, gradients $G_x$ and $G_y$ are applied with predetermined amplitudes to produce a resultant $G_r$ gradient along which a projection will be built up. A selective 90° RF pulse is applied concurrently with gradients $G_x$ and $G_y$. The frequency content of the pulse is selected so as to excite a nuclear spin in a strip-like region of planar slice 102 orthogonal to the $G_r$ gradient. The $G_x$ and $G_y$ gradients have, in interval 4, rephasing lobes for the purpose of reducing nuclear spin phase dispersion in a manner similar to that previously described for the $G_z$ gradient (e.g., interval 2, FIG. 2a).

The FID signal is produced by nuclear spins lying solely in the excited strip-like region and occurs in interval 5. As before, the FID sampled at a suitable rate. To obtain the next point in the projection, the amplitudes of the $G_x$ and $G_y$ gradients are held constant, while the frequency content of the 90° RF is adjusted to excite another strip-like region perpendicular to the $G_r$ gradient. Alternatively, the ratio of currents in each half of the $G_x$ and $G_t$ gradient coils can be varied, as noted above. This process is repeated until the desired number of points in the projection are obtained. Additional projections are obtained by varying the amplitudes of the $G_x$ and $G_y$ gradients to define a new direction for the $G_r$ gradient. Chemical shift image reconstruction is as previously discussed for FIG. 3a.

It should be noted that the pulse sequence of FIG. 3b may be modified to include a nonselective 180° RF pulse (not shown), following the application of the $G_x$ and $G_y$ gradients in intervals 3 and 4, to invert the spins producing the FID signal to obtain a spin echo signal. In this manner the spin echo signal is sampled without interference from gradient currents in a manner similar to that described hereinbefore with reference to FIG. 2b.

The NMR pulse sequences used for planar (two dimensional) chemical shift imaging may be extended to simultaneously obtain spectral data from an entire volume of the sample situated in the sensitive field of the RF transmitter and/or receiver coils, or from a selected thick planar slab (that is, multiple slices) of the sample.

An NMR pulse sequence suitable for three-dimensional chemical shift imaging, in which the data-gathering region is limited to a thick planar slab, is shown in FIG. 4a. This NMR pulse sequence is similar to many respects to that illustrated in FIG. 2b. However, the 90° RF selective pulse applied in interval 1 of FIG. 4a is selected to have a broader frequency bandwidth than the 90° selective pulse used in the pulse sequence of FIG. 2b, so that planar slice 102 (FIG. 1), in this case, will have a thickness profile equal to two (or more) times that obtained with the selective irradiation methods of FIGS. 2a-2c. The thickness of slice 102 is selected in accordance with the number of section images desired. Additionally, a variable amplitude, phase encoding component is added to the negative, rephasing component of the $G_z$ gradient in interval 2 of FIG. 4a to phase encode spatial information in the Z-axis direction within volume 102. In this manner, imaging information to construct a series of section images through sample 100 is obtained simultaneously from the enlarged volume 102. The effects of the rephasing and phase encoding components on the nuclear spins are linear and therefore may be applied simultaneously, as indicated. Following application of the phase encoding $G_x$, $G_y$ and $G_z$ gradients in interval 2, a nonselective 180° RF pulse is applied in interval 3 to produce a delayed spin echo signal which is sampled over interval $t_s$ at the desired rate. A spin echo signal is observed for each unique combination of $G_x$, $G_y$ and $G_z$ gradient amplitudes.

The number $n_x$, $n_y$ and $n_z$ amplitudes of gradients $G_x$, $G_y$ and $G_z$, respectively, is selected based on the number of spatial matrix points desired in thicker planar volume 102. Thus, $n_x$, $n_y$ and $n_z$ may each be selected to be equal to 10, for example. In this case $n_x \cdot n_y \cdot n_z$ echo signals will be obtained. The spin echo sampling rate is selected based on the number of spectral points desired at each spatial point in the matrix. Thus, if the spin echo signal is sampled 256 times in interval $t_s$, upon Fourier transformation, each spatial matrix point will contain 256 points of spectral data.

In practice, the $G_x$, $G_y$ and $G_z$ gradients may be sequenced through the programmable amplitudes in any convenient manner. One exemplary scheme is to select an amplitude for each of $G_z$ and $G_y$ gradients and in successive pulse sequences advance through $n_x$ amplitudes of the $G_x$ gradient. Thereafter, while holding $G_z$ constant, the amplitude of $G_y$ gradient is incremented to a new value, and $G_x$ gradient again stepped through $n_x$ amplitudes. After the $G_y$ gradient has been incremented $n_y$ times, the $G_z$ gradient is advanced one step and the process repeated for $n_y$ and $n_x$ amplitudes of $G_y$ and $G_x$ gradients, respectively. The process is repeated until the $G_z$ gradient has been sequenced through $n_z$ amplitudes.

The chemical shift imaging information is obtained as previously described, by Fourier transform techniques. In this case, a four-dimensional Fourier transform would be used. Three-dimensional transformation with respect to gradients $G_z$, $G_y$, and $G_x$ yields the three-dimensional spatial information from throughout the selected thick planar volume, and the final Fourier transformation with respect to time $t_s$ over which the spin echo is sampled yields the spectroscopic information.

An alternative NMR pulse sequence for performing three-dimensional chemical shift imaging is depicted in FIG. 4b. This pulse sequence is similar to that of FIG. 4a, with the exception that the data-gathering process is not restricted to a thick planar slab by selective excitation. Thus, in interval 1 (FIG. 4b) a nonselective 90° RF pulse is applied in the absence of any gradients. The detected spin echo signal originates from all nuclear spins which lie in the sensitive regions of the RF transmitter and receiving coils. Spatial information is encoded by application of the variable amplitudes of $G_x$, $G_y$, and $G_z$ gradients. Following observation of $n_x \cdot n_y \cdot n_y$ spin echo signals, spatial and chemical shift imaging data are obtained by four-dimensional transformation as previously described.

In FIGS. 2a-2c, 3a-3b, and 4a, the selective 90° and 180° RF pulses are schematically depicted as shaded rectangles. In practice, they may be, for example, Gaussian or sin (bt)/(bt), wherein b is a constant and t is time, amplitude modulated RF pulses having an RF frequency corresponding to the Larmor frequency of nuclear spins in the desired region of the NMR sample in the presence of gradients.

The spectral bandwidth of the selective 90° and 180° RF excitation pulses must be chosen to be sufficiently wide so as to excite the chemical shift spectrum of all of the chemical species of interest. Thus, for example, if selective pulses with too narrow a frequency bandwidth were used to study phosphorus chemical shift spectra in muscle metabolism, only a single specie (such as phosphocreatine) might be observed, whereas other species, such as adenosine triphosphate, adenosine diphosphate, inorganic phosphate, and sugar phosphates, may also be of interest.

Even if the RF pulses do excite relatively broad bandwidths, portions of the NMR sample located at the edge of the sensitive volume contain chemical species whose chemical shifts are such that they may lie outside the range of frequencies excited by the selective pulses.

Such chemical species will not contribute to the observed spectrum, whereas other species at the same location will provide a contribution, thus distorting the resulting spectrum. This undesirable effect may be minimized by reducing the relative contribution to the NMR spectrum from the edge spins. This may be accomplished by sharpening the excitation profile of the selective pulses to that sensitive volume 102 (FIG. 1) has sharply defined boundaries. To this end, the selective RF pulses may be preferably modulated by a signal of waveform sin (bt)/(bt) which has an approximately rectangularly shaped excitation profile.

Additional distortion of the spectra will occur if Gaussian-shaped RF pulses are used due to the rounded shape of the excitation frequency profile. In this case when using 180° pulses, portions of the sensitive volume and adjacent regions may actually receive excitation having a 90° component such that spurious NMR signals are produced. Relief from the spurious FID signals may be obtained by using extended $G_x$ and $G_y$ gradients and applying the 180° RF pulse at the midpoint thereof, as noted. However, care must be taken to ensure that the range of spectral frequencies to be observed is well within the FWHM (full width half maximum) of the excitation profile. Some correction of the edge distortion is obtained by multiplication by an inverse function of the excitation function.

Although gradients $G_x$, $G_y$, and $G_z$ in various figures have been illustrated as positive and negative rectangularly configured pulses, they may assume other configurations, such as Gaussian or sinusoidal. In the preferred embodiments, where the gradient is applied as part of a selective excitation sequence using a selective 90° pulse, the integral with respect to time of the respective positive gradient pulse waveforms is selected to be substantially equal to twice the integral with respect to time of the respective negative gradient pulse waveforms. Where the gradient is applied as part of a selective excitation sequence using a selective 180° pulse, the integral with respect to time of the respective gradient waveform before the midpoint of the 180° pulse is substantially equal to the integral with respect to time of the gradient waveform after the 180° pulse.

Figure 5:
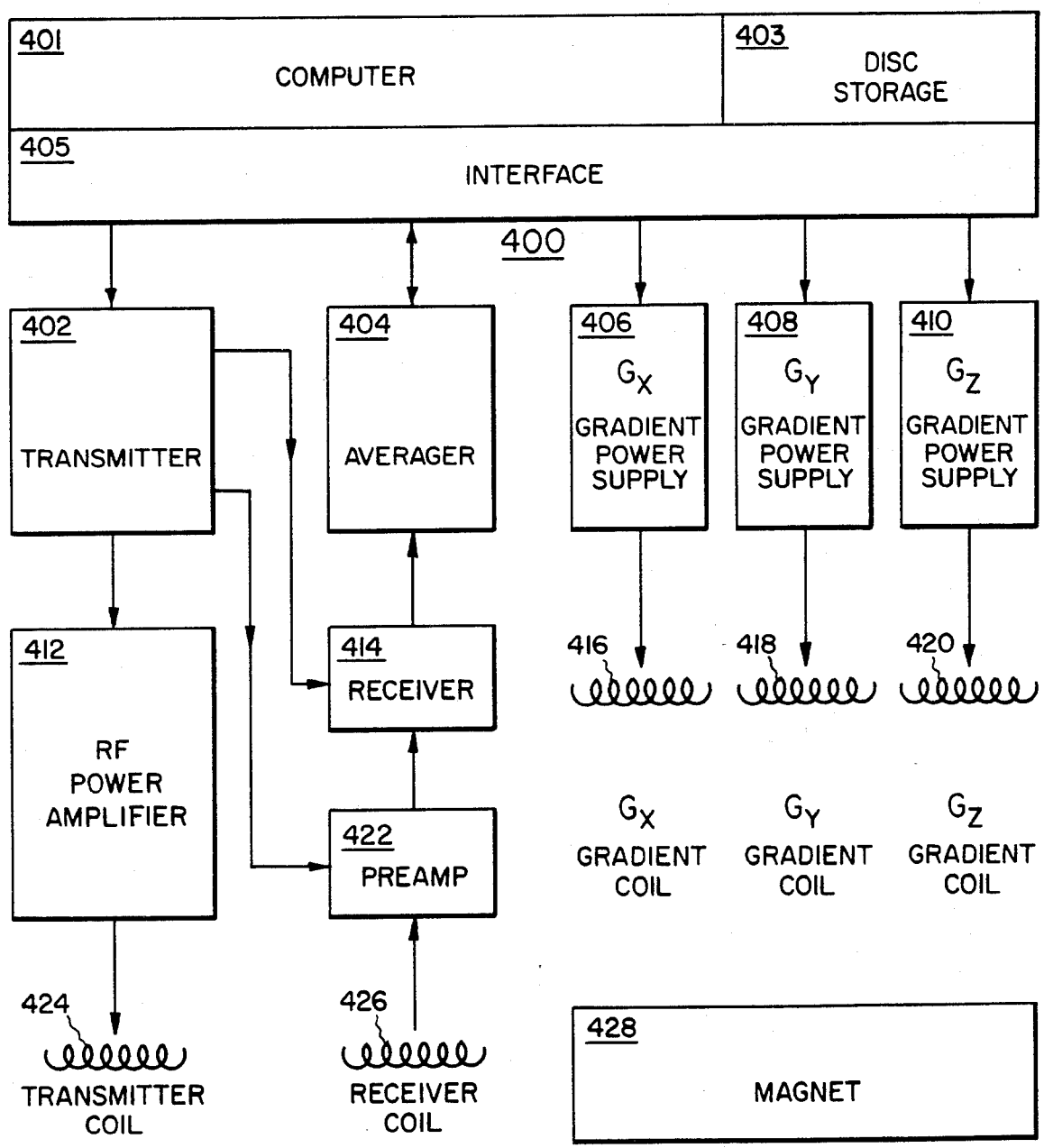
FIG. 5 illustrates a simplified block diagram of the major components of an NMR imaging apparatus suitable for producing the NMR pulse sequences shown in FIGS. 2, 3, and 4.

FIG. 5 is a simplified block diagram of the major components of an NMR system suitable for use with the NMR pulse sequences of the invention described herein. The system, generally designated 400, is made up of a general purpose minicomputer 401 which is functionally coupled to disk storage unit 403 and an interface unit 405. An RF transmitter 402, signal averager 404, and gradient power supplies 406, 408, and 410 for energizing, respectively, $G_x$, $G_y$, $G_z$ gradient coils 416, 418, and 420, are coupled to computer 401 through interface unit 405.

RF transmitter 402 is gated with pulse envelopes from computer 401 to generate RF pulses having the required modulation to excite resonance in the object under study. The RF pulses are amplified in RF power amplifier 412 to levels varying from 100 watts to several kilowatts, depending on the NMR method, and applied to transmitter coil 424. The higher power levels are necessary for large sample volumes, and where short duration pulses are required to excite large NMR frequency bandwidths.

The NMR signal is sensed by receiver coil 426, amplified in a low noise preamplifier 422, and applied for further amplification, detection, and filtering to receiver 414. The signal is then digitized for averaging by signal averager 404 and for processing by computer 401. Preamplifier 422 and receiver 414 are protected from the RF pulses during transmission by active gating or by passive filtering.

Computer 401 provides gating and envelope modulation for the NMR pulses, blanking for the preamplifier and RF power amplifier, voltage waveforms for the gradient power supplies and advances gradient amplitudes, and the frequency of RF pulses (when frequency scanning is employed). The computer also performs data processing such as Fourier transforms, image reconstruction, data filtering, imaging display, and storage functions (all of which are operations conventionally performed by minicomputers and hence described only functionally, supra).

Figure 6A:
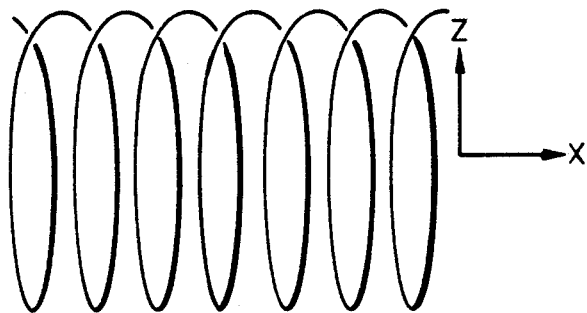
FIG. 6a illustrates an RF coil design for use with geometries for which the sample chamber is perpendicular to the static magnetic field.
Figure 6B:
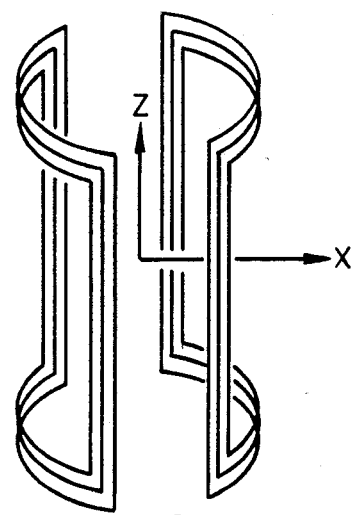
FIGS. 6b and 6c illustrate an RF coil design suitable for magnetic geometries for which the axis of the sample chamber is parallel to the static magnetic field.
Figure 6C:
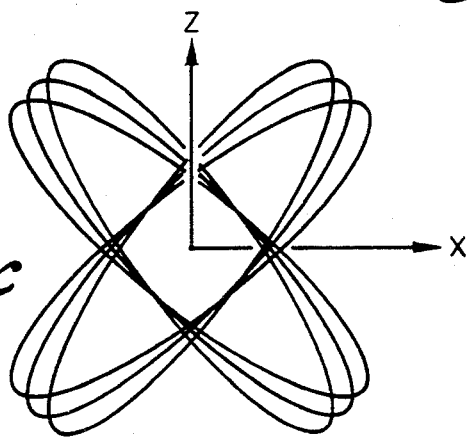

The transmitter and receiver RF coils, if desired, may comprise a single coil. Alternatively, two separate coils that are electrically orthogonal may be used. The latter configuration has the advantage of reduced RF pulse breakthrough into the receiver during pulse transmission. In both cases, the fields of coils are orthogonal to the direction of the static magnetic field $B_o$ produced by magnet 428 (FIG. 5). The coils are isolated from the remainder of the system by enclosure in an RF-shielded cage. Three typical RF coil designs are illustrated in FIGS. 6a, 6b, and 6c. All of these coils produce RF magnetic fields in the X-axis direction. The coil designs illustrated in FIGS. 6b and 6c are suitable for magnetic geometries for which the axis of the sample chamber is parallel to the main field $B_o$ (FIG. 1). The design illustrated in FIG. 5a is applicable to geometries for which the sample chamber axis is perpendicular to the main field $B_o$ (not shown).

Magnetic field gradient coils 416, 418, and 420 (FIG. 5) are necessary to provide gradients $G_x$, $G_y$, and $G_z$, respectively. In the NMR pulse sequences described herein, the gradients should be monotonic and linear over the sample volume. Non-monotonic gradient fields cause aliasing of the spatial information in the NMR signals, which leads to severe artifacts. Non-linear gradients cause geometric distortions of the data.

Figure 7A:
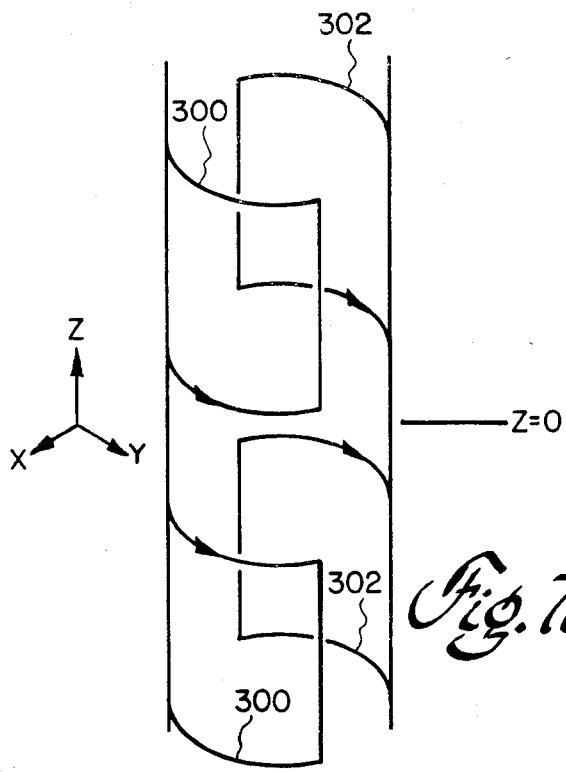
FIG. 7a illustrates a set of coils suitable for producing $G_x$ and $G_y$ gradients.
Figure 7B:
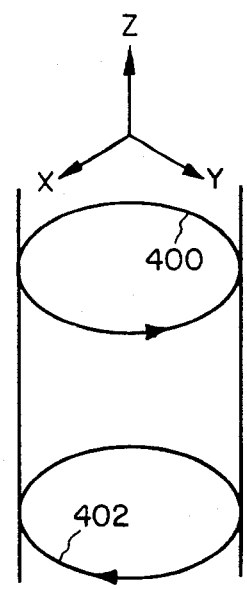
FIG. 7b depicts a coil configuration suitable for producing a $G_z$ gradient.

A design for gradient coils suitable for magnet geometries with a sample chamber axis parallel to the main field $B_o$ is depicted in FIGS. 7a and 7b. Each of the gradients $G_x$ and $G_y$ is produced by a set of coils such as sets 300 and 302 depicted in FIG. 7a. The coil sets as illustrated in FIG. 7a produce gradient $G_x$. The coil sets for producing gradient $G_y$ are rotated 90° around the cylindrical axis 104 (FIG. 1) of the sample chamber relative to the coil that produces gradient $G_x$. The $G_z$ gradient is generated by a coil pair such as coils 400 and 402 shown in FIG. 7b. If scanning is performed by changing the ratio of currents in each gradient coil set, the coil halves 300 and 302 (and the corresponding halves of the $G_y$ gradient coils) in FIG. 7a, 400 and 402 in FIG. 7b are energized by separate power supplies so that supplies 406, 408 and 410 in FIG. 5 may each actually consist of two separate power supplies.

From the foregoing, it will be appreciated that, in accordance with the invention, methods are provided for performing localized NMR chemical shift imaging in which the NMR signal is observed in the absence of magnetic field gradients. The efficiency of the imaging data collection process is improved by providing imaging methods in which data are gathered from many sample regions simultaneously.

While this invention has been and is described with reference to particular embodiments and examples, other modifications and variations will occur to those skilled in the art in view of the above teachings. Accordingly, it should be understood that within the scope of the appended claims the invention may be practiced otherwise than is specifically described.

We claim:

1. A method of performing NMR chemical shift imaging in which the imaging information is gathered simultaneously from a predetermined region of an NMR sample, said method comprising the steps of:
   (a) applying a static magnetic field along an axis of said NMR sample;
   (b) exciting to resonance a plurality of nuclear spins situated in said predetermined region such that said excited nuclear spins produce an NMR signal;
   (c) applying simultaneously, for a time shorter than the duration of said NMR signal, first and second mutually orthogonal magnetic field gradients each having one of a predetermined number of selectable magnitudes to phase encode into said NMR signal information of the spatial distribution of said excited nuclear spins within said predetermined region:
   (d) irradiating said NMR sample with a 180° RF pulse so as to invert said excited nuclear spins to obtain an NMR spin echo signal; and
   (e) observing said NMR spin echo signal in the absence of all magnetic field gradients to obtain said NMR signal for Fourier transformation to yield information of the spatial distribution of chemical shift spectra in said predetermined region.

2. The method of claim 1 further comprising the steps of:
   (f) repeating steps (b)-(e) for each one of said predetermined magnitudes of said second magnetic field gradient while holding the magnitude of said first magnetic field gradient constant; and
   (g) selecting the next one of the predetermined magnitudes of said first magnetic field gradient and repeating step (f).

3. The method of claim 2 wherein said step (b) comprises:
   irradiating said NMR sample with a selective 90° RF pulse in the presence of a magnetic field gradient having a direction selected to be coincident with the direction of said sample axis, and
   reversing the polarity of said last-mentioned magnetic field gradient and approximately halving the magnitude thereof so as to reduce the phase dispersion of said excited nuclear spins.

4. The method of claim 3 wherein said 90° RF pulse comprises an RF pulse amplitude modulated by a signal of waveform $(\sin bt)/bt$, wherein b is a constant and t is time.

5. The method of claim 3 wherein said 90° RF pulse comprises an RF pulse amplitude modulated to have a Gaussian-shaped envelope.

6. The method of claim 2 wherein said step (b) comprises:
   irradiating said NMR sample with a selective RF saturation pulse in the presence of a magnetic field gradient, having a direction selected to be coincident with said axis, so as to saturate nuclear spins situated in said NMR sample except those nuclear spins located in said predetermined region; and
   irradiating said NMR sample with a 90° RF pulse so as to excite to resonance nuclear spins in said predetermined region.

7. The method of claim 1 wherein said step (c) further comprises applying a third magnetic field gradient having a predetermined number of selectable magnitudes, said third magnetic field gradient being orthogonal to said first and second magnetic field gradients, the direction of one of said gradients being selectable to be coincident with the direction of said sample axis.

8. The method of claim 7 further comprising the steps of:
   (h) repeating said steps (b)-(3) for each one of said predetermined magnitudes of said third magnetic field gradient, while holding the respective magnitudes of said first and second magnetic field gradients constant;
   (i) selecting the next one of the predetermined magnitudes of said second magnetic field gradient and repeating said step (h); and
   (j) selecting the next one of the predetermined magnitudes of said first magnetic field gradient and repeating said steps (h) and (i).

9. The method of claim 8 wherein said step (b) comprises:
   irradiating said NMR sample with a selective 90° RF pulse in the presence of a magnetic field gradient having a direction selected to be coincident with the direction of said sample axis; and
   reversing the polarity of said last-mentioned magnetic field gradient and approximately halving the magnitude thereof so as to reverse the phase dispersion of said excited nuclear spins.

10. The method of claim 9 wherein said 90° RF pulse comprises an RF pulse amplitude modulated by a signal of waveform $(\sin bt)/bt$, wherein b is a constant and t is time.

11. The method of claim 9 wherein said 90° RF pulse comprises an RF pulse amplitude modulated to have a Gaussian-shaped envelope.

12. The method of claim 8 wherein said step (b) comprises:
   irradiating said NMR sample with a selective RF saturation pulse in the presence of a magnetic field gradient, having a direction selected to be coincident with said axis, so as to saturate nuclear spins situated in said NMR sample except those nuclear spins located in said predetermined region; and
   irradiating said NMR sample with a 90° RF pulse so as to excite to resonance nuclear spins in said predetermined region.

13. A method of performing NMR chemical shift imaging using multiple angle projection reconstruction in which the imaging information is gathered simultaneously from a predetermined region of an NMR sample, said method comprising the steps of:
   (a) applying a static magnetic field along an axis of said NMR sample;
   (b) exciting to resonance a plurality of nuclear spins situated in said region such that said excited nuclear spins produce an NMR signal;
   (c) applying a magnetic field gradient having one of a predetermined number of selectable orientations within said region;
   (d) irradiating said NMR sample with a selective RF pulse in the presence of said gradient, said RF pulse having a predetermined frequency content selectable to invert a fraction of said excited nuclear spins situated in one of a predetermined number of strip-like regions oriented orthogonal to the direction of said gradient, said inverted nuclear spins producing an NMR spin echo signal; and (e) observing said NMR spin echo signal in the absence of said gradient, such that Fourier transformation of said observed NMR signal yields one point of imaging information in a projection having a direction coincident with that of said gradient.

14. The method of claim 13 further comprising:

(f) repeating said steps (a)–(e) while changing the frequency content of said RF pulse with each repetition so as to invert nuclear spins situated in a different one of said predetermined strip-like regions, the number of repetitions being equal to the desired number of spatial points in said projection; and (g) repeating said step (f) for each one of said predetermined number of directions of said gradient to obtain a corresponding number of projections.

15. The method of claim 14 wherein said magnetic field gradient comprises a resultant gradient of the vectorial addition of first and second magnetic field gradient components each applied orthogonal to said axis.

16. The method of claim 15 wherein said RF pulse in said step (d) comprises a selective 180° pulse, and wherein said first and second gradient components are selectable such that the respective integrals of the waveforms thereof with respect to time over the interval prior to irradiation with said 180° RF pulse are equal to the respective integrals of the waveform thereof with respect to time over the interval following irradiation with said 180° RF pulse.

17. The method of claim 16 wherein said step (b) comprises:

irradiating said NMR sample with a selective 90° RF pulse in the presence of a magnetic field gradient having a direction selected to be coincident with the direction of said sample axis; and reversing the polarity of said last-mentioned magnetic field gradient and approximately halving the amplitude thereof so as to reverse the phase dispersion of said excited nuclear spins.

18. The method of claim 17 wherein said 90° RF pulse and said 180° RF pulse comprise, respectively, an RF pulse amplitude modulated by a signal of waveform (sin bt)/bt wherein b is a constant and t is time.

19. The method of claim 17 wherein said 90° RF pulse and said 180° RF pulse comprise, respectively, an RF pulse amplitude modulated to have a Gaussian-shaped envelope.

20. The method of claim 13 further comprising the steps of:

(h) repeating said steps (a)–(e) while changing the ratio of currents in at least one coil of a coil pair producing said magnetic field gradient and maintaining the frequency content of said selective RF pulse unchanged so as to invert nuclear spins situated in a different one of said predetermined strip-like regions, the number of repetitions being equal to the desired number of spatial points in said projection; and (i) repeating said step (h) for each one of said predetermined number of orientations of said gradient to obtain a corresponding number of projections.

21. The method of claim 20 wherein said magnetic field gradient comprises a resultant gradient of the vectorial addition of first and second magnetic field gradient components each applied orthogonal to said axis.

22. The method of claim 21 wherein said RF pulse in said step (d) comprises a selective 180° pulse, and wherein said first and second gradient components are selectable such that the respective integrals of the waveforms thereof with respect to time over the interval prior to irradiation with said 180° RF pulse are equal to the respective integrals of the waveform thereof with respect to time over the interval following irradiation with said 180° RF pulse.

23. The method of claim 22 wherein said step (b) comprises:

irradiating said NMR sample with a selective 90° RF pulse in the presence of a magnetic field gradient having a direction selected to be coincident with the direction of said sample axis; and reversing the polarity of said last-mentioned magnetic field gradient and approximately halving the amplitude thereof so as to reduce the phase dispersion of said excited nuclear spins.

24. The method of claim 23 wherein said 90° RF pulse and said 180° RF pulse comprise, respectively, an RF pulse amplitude modulated by a signal of waveform (sin bt)/bt wherein b is a constant and t is time.

25. The method of claim 23 wherein said 90° RF pulse and said 180° RF pulse comprise, respectively, an RF pulse amplitude modulated to have a Gaussian-shaped envelope.

26. A method of performing NMR chemical shift imaging using multiple angle projection reconstruction in which the imaging information is gathered simultaneously from a predetermined region of an NMR sample, said method comprising the steps of:

(a) applying a static magnetic field along an axis of said NMR sample;

(b) irradiating said NMR sample with a first selective RF saturation pulse in the presence of a first magnetic field gradient, having a direction selectable to be coincident with said axis, so as to saturate nuclear spins in said NMR sample except for those nuclear spins located in said predetermined region;

(c) applying a second magnetic field gradient having one of a predetermined number of selectable directions within said region;

(d) irradiating said NMR sample with a second selective RF pulse in the presence of said second magnetic field gradient, said selective RF pulse having a predetermined frequency content selectable to excite nuclear spins situated in one of a predetermined number of strip-like portions of said region oriented orthogonal to the direction of said second gradient, said excited nuclear spins producing an NMR signal; and (e) observing said NMR signal in the absence of said gradients, such that Fourier transformation of said observed NMR signal yields one point of spectral imaging information in a projection having a direction coincident with that of said second gradient.

27. The method of claim 26 further comprising the steps of:

(f) repeating said steps (a)–(e) while changing the frequency content of said second selective RF pulse with each repetition so as to excite a different one of said predetermined strip-like portions of said region to obtain the desired number of points in said projection; and (g) repeating said step (f) for each one of said predetermined number of directions of said second gradient to obtain a corresponding number of projections.

28. The method of claim 27 wherein said second selective RF pulse comprises a selective 90° RF pulse, and wherein said second gradient is a resultant gradient of the vectorial addition of first and second gradient components, each of said first and second gradient components further including respective gradient components for reversing the phase dispersion of said excited nuclear spins.

29. The method of claim 28 wherein said 90° RF pulse comprises an RF pulse amplitude modulated by a signal of waveform (sin bt)/bt, wherein b is a constant and t is time.

30. The method of claim 28 wherein said 90° RF pulse comprises an RF pulse amplitude modulated to have a Gaussian-shaped envelope.

31. The method of claim 28 further comprising:
irradiating said NMR sample with a non-selective 180° RF pulse so as to invert said excited nuclear spins to obtain an NMR spin echo signal which is observed in step (e).

32. The method of claim 26 further comprising the steps of:
(h) repeating said steps (a)–(e) while changing the ratio of currents in at least one coil of a coil pair producing said second magnetic field gradient and maintaining the frequency content of said second selective RF pulse unchanged so as to invert nuclear spins situated in a different one of said predetermined strip-like regions to obtain the desired number of spatial points in said projection; and
(i) repeating said step (h) for each one of said predetermined number of directions of said gradient to obtain a corresponding number of projections.

33. The method of claim 32 wherein said second selective RF pulse comprises a selective 90° RF pulse, and wherein said second gradient is a resultant gradient of the vectorial addition of first and second gradient components, each of said first and second gradient components further including respective gradient components for reducing the phase dispersion of said excited nuclear spins.

34. The method of claim 33 wherein said 90° RF pulse comprises an RF pulse amplitude modulated by a signal of waveform (sin bt)/bt, wherein b is a constant and t is time.

35. The method of claim 33 wherein said 90° RF pulse comprises an RF pulse amplitude modulated to have a Gaussian-shaped envelope.

36. The method of claim 33 further comprising:
irradiating said NMR sample with a non-selective 180° RF pulse so as to invert said excited nuclear spins to obtain an NMR spin echo signal which is observed in step (e).

* * * * *